United States Patent
Eichfeld et al.

(10) Patent No.: US 6,777,974 B2
(45) Date of Patent: Aug. 17, 2004

(54) ARRANGEMENT AND METHOD FOR ADJUSTMENT OF THE SLOPE TIMES FOR ONE OR MORE DRIVERS AND A DRIVER CIRCUIT

(75) Inventors: Herbert Eichfeld, Munich (DE); Ralf Klein, Diedesheim (DE); Dirk Romer, Munich (DE); Christian Paulus, Munich (DE)

(73) Assignee: Infineon Technologies AG (DE)

( * ) Notice: Subject to any disclaimer, the term of this patent is extended or adjusted under 35 U.S.C. 154(b) by 1 day.

(21) Appl. No.: 10/148,747

(22) PCT Filed: Jan. 5, 2001

(86) PCT No.: PCT/DE01/00019
§ 371 (c)(1),
(2), (4) Date: Nov. 5, 2002

(87) PCT Pub. No.: WO01/54275
PCT Pub. Date: Jul. 26, 2001

(65) Prior Publication Data
US 2003/0179029 A1 Sep. 25, 2003

(30) Foreign Application Priority Data
Jan. 20, 2000 (DE) .......................... 100 02 376

(51) Int. Cl.$^7$ ............................................. H03K 17/16
(52) U.S. Cl. ............................. 326/26; 326/27; 326/21; 327/108; 327/170; 327/134
(58) Field of Search .............................. 326/26, 27, 21; 327/108, 109, 110, 170, 134, 374, 380, 381, 377, 437

(56) References Cited

U.S. PATENT DOCUMENTS

| 4,567,378 A | 1/1986 | Raver |
| 4,945,292 A | 7/1990 | Ackerson et al. |
| 4,962,344 A * | 10/1990 | Bohrer ........................ 327/134 |
| 5,742,193 A * | 4/1998 | Colli et al. .................. 327/170 |
| 5,939,909 A * | 8/1999 | Callahan, Jr. ............... 327/108 |
| 6,265,921 B1 * | 7/2001 | Heinrich ..................... 327/170 |

FOREIGN PATENT DOCUMENTS

| DE | 40 18 754 A | 12/1991 |
| DE | A-4 018 754 | 12/1991 |
| DE | A-44 415 23 C1 | 5/1998 |
| DE | 199 00 383 A1 | 7/1999 |
| DE | 198 25 890 A1 | 12/1999 |
| DE | 198 41 719 A1 | 3/2000 |
| EP | 0 264 470 A | 4/1988 |
| EP | A-0 436 316 A1 | 7/1991 |
| GB | 2 299 720 A | 10/1996 |

* cited by examiner

*Primary Examiner*—Vibol Tan
(74) *Attorney, Agent, or Firm*—Altera Law Group, LLC; Jeffrey R. Stone

(57) ABSTRACT

The invention relates to an arrangement (10) and a method for adjusting the slope times of one or more drivers (90) in such a way that the adjustment is essentially independent of external conditions. The invention also relates to a driver circuit. The arrangement (10) is provided with a device (20) for detecting the time history of an output voltage that is output and supplied to a load (12) by means of the driver/s (90). The measured time values are converted into an output voltage value in a device (36) for converting the measured time history of the output voltage. Moreover, a device (40) for generating a reference voltage value is provided. The device (40) is connected to a device (60) for predetermining a desired slope time for the driver/s (90), whereby the slope time is essentially independent of external conditions. A system pulse can be partitioned into differently long rectangular pulses in the device (60) in such a way that the user of the arrangement (10) can select from the group of the rectangular pulses which match certain slope times respectively. The output voltage value and the reference voltage value are compared in a comparing device (50) that is also connected to the driver/s (90) in such a way that the driver/s (90) can be readjusted thereby.

29 Claims, 3 Drawing Sheets

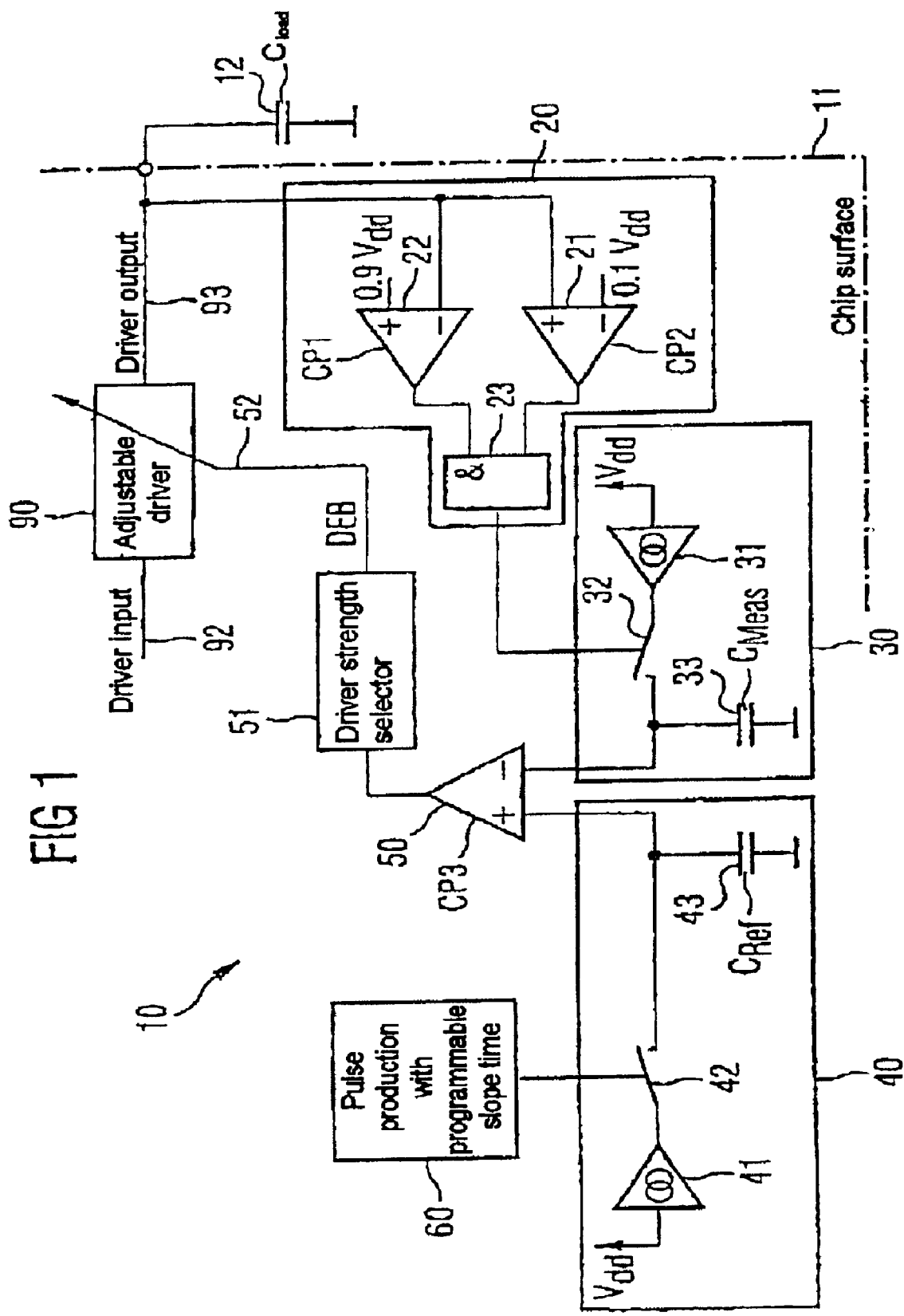

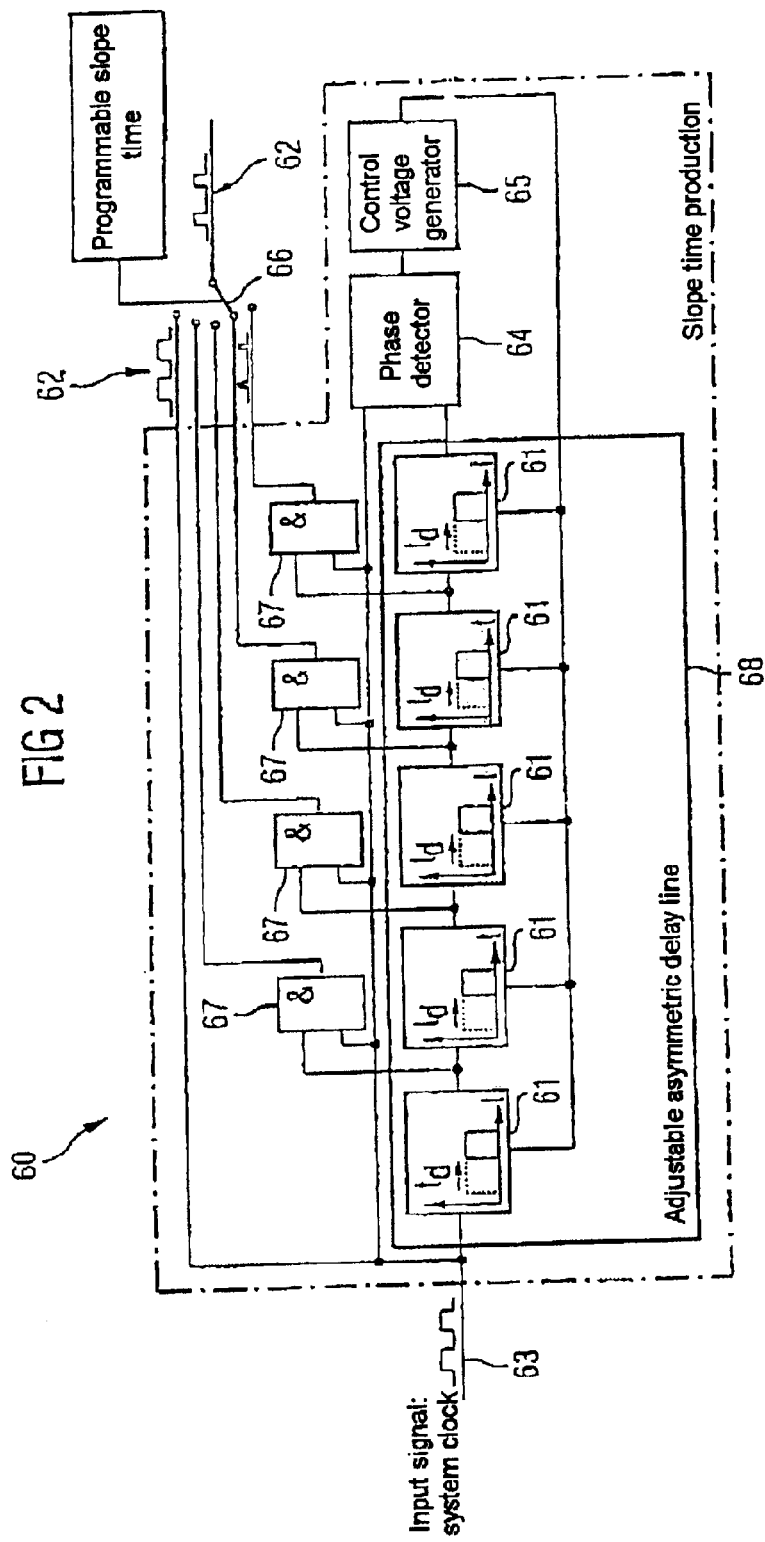

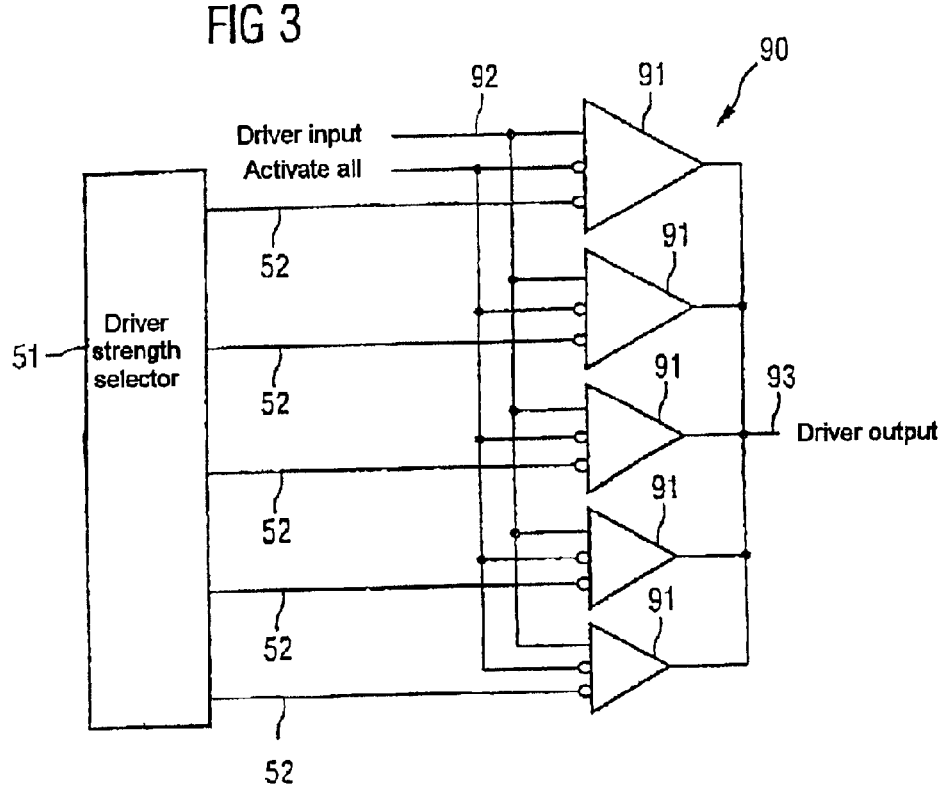

ARRANGEMENT AND METHOD FOR ADJUSTMENT OF THE SLOPE TIMES FOR ONE OR MORE DRIVERS AND A DRIVER CIRCUIT

BACKGROUND OF THE INVENTION

1. Field of the Invention

The present invention relates first of all to an arrangement and to a method for adjustment of the slope times for one or more drivers essentially independently of external conditions. The invention also relates to a driver circuit and to advantageous applications.

2. Description of the Related Prior Art

Drivers and driver circuits are known, for example, as pad drivers for integrated circuits such as microcontrollers, microprocessors, ASICs, memory modules or the like and, to a major extent, govern the electromagnetic compatibility (EMC) of digital assemblies, for example of controller devices for motor vehicle or automation technology.

The relatively large current transients (dI/dt) which are required in order to charge and to discharge the generally capacitive loads, which are connected to the drivers, in a relatively short time to a specific voltage potential are a critical factor for such drivers and driver circuits. These times, which are referred to as the rise times (trise) and fall times (tfall) relate to the respectively rising and falling slope and are quoted for a specific maximum load in the specification for the driver. Normally, the driver strength is designed such that the driver comprises the guaranteed driver and timing characteristics in the worst permissible environmental conditions (referred to as the worst case).

For CMOS circuits, which are known per se, such worst case conditions are, for example, high ambient temperatures, low operating voltages, poor production parameters, that is to say production parameters which lead to "slow" switching times, and a maximum load, or the like. Since worst case conditions generally occur only rarely, the output slopes of conventional drivers designed in such a way are very much steeper than necessary, thus making the disturbance spectrum worse. The slope times—rise time/fall time—are likewise not constant either, owing to the possibility of the environmental conditions changing.

An ideal driver in terms of electromagnetic compatibility has the maximum permissible slope times, which are independent of external conditions, such as the ambient temperature, the operating voltage, the individual production parameters, and the connected load or the like. Furthermore, the maximum permissible slope times are dependent on the respective application of the drivers. For example, memory buses require a much shorter access time than, for example, input signals for an electrical switch (referred to as a smart power switch).

Experiments have shown that a significant improvement in the electromagnetic compatibility of output drivers can be achieved by reducing the driver strength and, associated with this, by increasing the slope times.

There is thus a need to be able to adjust the slope times of drivers individually.

DE-A-44 415 23 C1 discloses a digital driver circuit for an integrated circuit, in which the driver circuit can be matched to a specific application by the operator himself. Depending on the nature of the application, in this case depending on the load capacitance of a component which is to be operated using the driver circuit, this operator must enter an appropriate figure in an input apparatus. The figure is a variable which is dependent on the application. Physically, this circuit is a controller. The known solution assumes that variations in the environmental conditions can be established unambiguously by measuring the saturation current of a measurement transistor.

EP-A-0 436 316 A1 also specifies a circuit arrangement, which matches the impedance of a driver to a connected network. In this case, the circuit arrangement is intended to be suitable for being able to match itself to a load with an initially unknown impedance. To do this, the circuit arrangement has a driver with a predetermined impedance. An element for optional selection of an impedance is connected to the driver and, on operation, selectively causes changes to the predetermined impedance to match a desired, different impedance of the connected load. A further element is connected to this element for selection of the impedance. This element measures the impedance difference between the output of the driver and a digital circuit which is connected to it. A suitable impedance is selected on the basis of the measured values from the element for selection of the impedance, and is added to the predetermined, impedance, that is to say the preset impedance of the driver.

BRIEF SUMMARY OF THE INVENTION

One object of the present invention is to provide an improved arrangement, and a method for adjustment of slope times for one or more drivers, as well as an improved driver circuit, by means of which, in particular, the slope times for one or more drivers can be adjusted in a simple manner, and essentially independently of external conditions.

According to the first aspect of the invention, this object is achieved by an arrangement for adjustment of the slope times for one or more drivers essentially independently of external conditions, having an apparatus for recording the time profile of an output voltage which is emitted from the driver or drivers to a load, having an apparatus for conversion of the measured time profile of the output voltage to an output voltage value, having an apparatus for production of a reference voltage value, having a device for presetting a desired slope time, which is essentially independent of external conditions, for the driver or drivers, which device is connected to the apparatus for production of a reference voltage value, and having a device for comparison of the output voltage value with the reference voltage value, in which case the comparison device is or can be connected to the driver or drivers.

The arrangement according to the invention makes it possible to adjust the slope times for drivers independently of external conditions. In particular, it is possible to adjust the slope times for the drivers independently of the temperature, operating voltage, production process and load. These external conditions are enumerated purely way of example, so that the slope times can also be adjusted independently of other external conditions which are not explicitly mentioned in this enumeration.

The arrangement according to the invention means that one or more drivers is or are calibrated by a control cycle, which can preferably be repeated, such that the user of such a driver can adjust and set desired slope times, which can be selected within wide limits, largely independently of the external conditions.

The fundamental principle of the arrangement according to the invention is to generate a reference voltage value which corresponds to the desired slope time which can be programmed by the user. This reference voltage value is compared with an actually measured output voltage value. The driver or drivers is or are matched as a function of this comparison result.

When the driver or drivers is or are activated, the driver emits an output voltage. This output voltage is passed to a load. If the load which is connected to the driver or drivers is a load capacitance, this load capacitance is charged to an operating voltage Vdd on the basis of the output voltage which is emitted from the driver or drivers. When the driver or drivers is or are activated, the output voltage at the driver output will rise until the operating voltage Vdd is reached. An analogous situation applies to the converse case.

This time profile of the output voltage is recorded by the apparatus for recording the time profile, and this apparatus is specified in more detail further on in the description.

Since, in general, time values can be compared with one another only poorly, the measured time values are converted to an output voltage value in the apparatus for conversion of the measured time profile of the output voltage. This output voltage value can be temporarily stored.

At the same time, an appropriate reference voltage value is produced in the apparatus for production of a reference voltage value, which will be explained in more detail further on in the description. The reference voltage value is produced in such a way that a desired, freely variable slope time, which is essentially independent of external conditions, is preset for the driver or drivers via a device which allows the user of the arrangement to preset a slope time. For the reasons mentioned above, this time signal is in turn converted to a voltage value, the reference voltage value. The reference voltage value can in turn be temporarily stored.

The output voltage value and the reference voltage value are then compared with one another in the comparison device. This comparison device is likewise connected, or can be connected, to the driver or drivers, so that the driver or drivers, or its or their driver strength, can be matched by means of the signals which are emitted from the comparison device.

Preferred embodiments of the arrangement according to the invention can be found in the dependent claims.

The arrangement according to the invention will be explained in the following text with reference to an example, although, of course, the invention is not restricted to the specific example form. This specific example form serves only to illustrate the relationships in the arrangement according to the invention.

This example assumes that, at the moment at which a driver input changes its state, the driver is switched such that a connected load, for example a load capacitance, is charged or discharged via a driver output line. In the following text, it is assumed that the driver input signal changes from low to high at the time t=0, which means that the previously discharged load capacitance is intended to be charged to the operating voltage Vdd over the further course of time. An analogous situation applies to the converse case.

The apparatus for recording the time profile of the output voltage emitted from the driver or drivers to a load may preferably be in the form of a window comparator.

This window comparator may advantageously have two voltage comparators (CP1, CP2), which are connected to an AND gate.

The time profile of the output voltage at the driver output can be monitored up to the operating voltage Vdd via a window comparator such as this. The output of the window comparator may be switched to high, for example, during the rise time or the fall time of the voltage signal.

The rise time, or the fall time, may, for example, be that time period which a signal requires to change from 10% to 90% of the final voltage.

The two voltage comparators CP1, CP2 may, for example, be designed accordingly. One of the voltage comparators may, for example, produce a corresponding high signal once the voltage signal has exceeded the 10% mark of the final voltage. The other voltage comparator, may, for example, emit a high signal until the voltage signal has reached the 90% mark of the final voltage. The two signals from the respective voltage comparators are joined together in the AND gate. When both voltage comparators produce a high signal, the voltage signal which is emitted from the driver is in its rise time, or in its fall time.

In terms of formulae, the output of the window comparator is thus high when:

$$fu*Vdd < Vout < fo*Vdd,$$

where, for example, fu=0.1, fo=0.9, Vdd=operating voltage and Vout=output voltage.

In a further refinement, the apparatus for conversion of the measured time profile of the output voltage to an output voltage value may have a current source, a switch element and a capacitance, in which case the switch element is operated or can be operated via signals from the apparatus for recording the time profile of the output voltage which is emitted from the driver or drivers to a load.

The measured time value is converted to a voltage value in this apparatus. To do this, the switch element may, for example, be closed during the high state of the apparatus in order to record the time profile of the output voltage (advantageously of the window comparator), by which means a previously discharged capacitance (for example a measurement capacitance Cmeas) is charged by means of the current source to an output voltage value (Vmeas).

The apparatus for production of a reference voltage value may advantageously have a current source, a switch element and a reference capacitance, in which case the switch element is operated or can be operated via signals from the device for presetting a desired slope time for the driver or drivers. A structure such as this allows the reference capacitance (Cref) to be charged to a reference voltage value (Vref) in the manner described above.

The period during which the switch element is closed is preset by the user of the arrangement by operating the device for presetting a desired slope time, which is essentially independent of external conditions, for the driver or drivers, which device will be explained in more detail further on in the description. The time period during which the switch element is closed thus corresponds to the desired rise time, or fall time.

In a further refinement, the device for comparison of the output voltage value with the reference voltage value may be in the form of a comparator. This voltage comparator (CP3) compares the output voltage value (Vmeas) with the reference voltage value (Vref). When Vmeas<Vref, the capacitance for the output voltage has been charged for a shorter time than the reference capacitance. The actual rise time, or fall time, was accordingly shorter than that desired. The voltage comparator (CP3) can indicate this, for example, by outputting a high level, thus reducing the driver capability of a connected driver. An analogous situation applies to the case where Vmeas>Vref.

The control cycle starts once again on the next rising or falling slope, so that the driver is successively matched to the load and to the desired slope time.

An apparatus for selection of the driver strength can preferably be provided, with this apparatus being connected to the device for comparison of the output voltage value with the reference voltage value, and in which case the apparatus for selection of the driver strength is or can be connected to the driver or drivers as well. The apparatus can be connected to the driver or drivers via appropriate control lines which are referred to, for example, as a driver enable bus (DEB).

The device for presetting the desired slope time for the driver or drivers can preferably be designed to produce a square-wave pulse, whose length corresponds to the desired slope time.

The essential feature for the quality of the driver regulation, or driver adjustment, is the exact generation of the desired slope time. This must not be dependent on external conditions, such as variations in the production process, fluctuations in the ambient temperature, the magnitude of the supply voltages or the like. On-chip circuits are very largely impractical for this purpose, since they are subject to these influences and compensation would involve major complexity.

It is therefore advantageously possible to provide for the device for presetting the desired slope time for the driver or drivers to be designed for processing a system clock. A system clock such as this is available, for example, in microcontrollers, microprocessors and in most ASICs. The system clock is generally generated from an external crystal, or oscillator, and may be assumed to be constant with regard to the stated external conditions.

If the clock frequency of the system clock is equal to fmc (mc=master clock), then the pulse length $t=1/(2*fmc)$ can be tapped off directly. Different pulse widths of duration $t=2^n/(2*fmc)$ where $n>0$ can be produced by means of frequency dividers.

If pulse lengths such that $t<1/(2*fmc)$ are required, so-called phase locked loop circuits may be used. It is likewise possible to use a circuit which has the features described in the following text.

The device for presetting the desired slope time for the driver or drivers may preferably have one or more delay elements. Each delay element delays the output of the rising slope at its output as a function of a control voltage (Vctrl). The input signal is, for example, a relatively low-frequency system clock which, when a number of delay elements are used, passes through a delay line formed by such delay elements.

Furthermore, the device for presetting the desired slope time for the driver or drivers may have at least one phase detector. A phase detector such as this checks whether the falling slope of the input signal (master clock) occurs at the same time as the rising slope, which is emitted with the delay, at the output from the delay line.

If this is not the case, depending on which level change took place first, the control voltage is changed such that the phase difference becomes less in the next cycle. An apparatus for production of such a control voltage may be provided, for example, in order to produce the control voltage.

The falling slope of the input signal may be passed on virtually without any delay by the delay element, or by the delay elements. If the input signal is in each case linked to the output of each delay element via appropriate AND gates, the input signal itself results in n parallel signals which have high level durations of $tmin, 2*tmin, 3*tmin, \ldots, n*tmin$, where n=the number of delay elements, and $tmin=1/(2*n*fmc)$.

The device for presetting the desired slope time for the driver or drivers may advantageously have at least one switch element, in particular a multiplexer, for switching between different slope signals. This switch element allows the user to select a signal which he desires and which then corresponds to the desired slope time. The switch element is preferably in the form of a multiplexer. Multiplexers such as these are already known per se. They have a decoder which may select a desired one of n inputs, which is then passed to an output. Multiplexers can be produced both with gates and with analog switches using CMOS technology.

A configuration such as this of the device for presetting the desired slope time for the driver or drivers first of all makes it possible to compensate for fluctuations in the external conditions in a manner which is simple but nevertheless very accurate. Furthermore, a device such as this has the advantage that there is a fixed and clear relationship between the selected output pulse duration (slope time) and the system clock frequency.

According to a second aspect of the present invention, a driver circuit is provided for driving a load and has one or more drivers which is or are connected to the load. This driver circuit is, according to the invention, characterized in that the driver or drivers is or are connected to an arrangement according to the invention as described above, for adjustment of the slope times.

The driver circuit according to the invention makes it possible for the driver or drivers to be calibrated by means of an—advantageously repeating—control cycle in such a manner that the slope times which are desired by the user and which can be selected within wide limits can be set or can be achieved largely independently of external conditions. With regard to the advantages, influences, effects and method of operation of the driver circuit according to the invention, reference is likewise made to the above statements relating to the arrangement according to the invention and to the following statements relating to the method according to the invention, whose entire contents are explicitly referred to here.

Preferred embodiments of the driver circuit can be found in the dependent claims.

The driver or drivers may preferably be in the form of a scalable driver or scalable drivers.

Each driver may advantageously comprise one or more driver elements. The use of a number of driver elements is known per se and is described, for example, in DE-195 45 904.0, which was likewise submitted by this applicant and whose disclosure content is to this extent also included in the description of the present invention.

If a scalable driver comprises a specific number of driver elements, preferably in parallel, these driver elements can be enabled or inhibited individually by means of control lines (driver enable bus DEB). When the driver input changes its state, all the enabled driver elements switch in a corresponding manner and charge, or discharge, a connected load via the driver line output.

The splitting of the driver into a number of partial driver elements has the further advantage that a high output impedance can be achieved at a low driver power level, and that, in consequence, it is possible to reduce the extent to which disturbances are coupled onto the supply lines. Furthermore, it is worthwhile to make the transistor widths in each driver stage each twice as great as those in the next lower stage. This means that it is possible to select the driver stages by means of a driver strength selector in the form of a binary counter, so that the resultant driver strength range can be covered in equal steps.

The increase or decrease in the driver strength after a control cycle may in this case correspond, for example, to the driver strength of the smallest driver stage.

One or more drivers may in each case advantageously be connected to an arrangement for adjustment of the slope times. As has already been described in the introduction, drivers are preferably used in conjunction with integrated circuits. Circuits such as these are, for example, integrated on a chip, on which only a very small amount of space is normally available. In order to save chip surface area, fewer arrangements for adjustment of the slope times are preferably provided than the number of drivers connected to them.

In this case, the individual drivers can each be connected to one arrangement via suitable switch elements, for example a multiplexer as already described above. This makes it possible to successively regulate the strengths of a number of output drivers, which are advantageously scalable, in the process of which the respective, optimum driver strengths can be temporarily stored. Furthermore, a circuit arrangement such as this advantageously makes it possible for the regulation process to be carried out only in certain phases, for example the so-called set-up phases, and for the driver strengths which have been found then to be checked at suitably selected time intervals.

The load which is connected to the driver or drivers may advantageously be in the form of a capacitive load. This is the most frequent configuration form of such loads, particularly in the field of CMOS circuits. Nevertheless, the invention is not restricted to capacitive loads, so that resistive or inductive loads as well as any desired combinations of the individual load types are feasible in all cases.

According to a third aspect of the present invention, a method is provided for adjustment of the slope times for one or more drivers essentially independently of external conditions, which method can be carried out, in particular, using an arrangement according to the invention as described above. This method is characterized by the following steps:

a) measurement of the time profile of an output voltage which is emitted from the driver or drivers to a load;
b) conversion of the measured time profile of the output voltage to an output voltage value;
c) production of a reference voltage value which is essentially independent of external conditions;
d) comparison of the output voltage value with the reference voltage value; and
e) matching of the driver or drivers as a function of the comparison results.

The method according to the invention allows the driver or drivers to be calibrated in a simple manner such that slope times which are desired by the user and can be selected within wide limits can be achieved or set largely independently of external conditions. With regard to the advantages, influences, effects and method of operation of the method according to the invention, reference is likewise made to the above statements relating to the arrangement according to the invention and to the driver circuit according to the invention, whose entire contents are explicitly referred to here.

Advantageous embodiments of the method can be found in the dependent claims.

The fundamental principle of the method according to the invention is to generate a reference voltage value which corresponds to the programmable slope time which is desired by the user. This reference voltage value is compared with an actually measured output voltage value. The driver is matched as a function of this comparison result.

The time profile of the output voltage can advantageously be measured by measuring its rise time and/or its fall time.

The measured time profile of the output voltage can preferably be converted in an apparatus for conversion to an output voltage value. This is advantageous since voltage values can be compared considerably more easily and accurately than would be possible in the case of time values.

The apparatus for conversion of the time profile of the output voltage may advantageously have a current source, a switch element and a capacitance, with the time profile of the output voltage being converted to an output voltage value by closing the switch element during a predetermined time period, in particular during the rise time and/or the fall time of the output voltage, and such that, during this time period, the previously discharged capacitance is charged by means of the current source to the output voltage value.

In a further refinement, the reference voltage value can be produced in an apparatus for production of a reference voltage value, with the apparatus having a current source, a switch element and a reference capacitance, by the switch element being closed via a device for presetting a desired slope time, which is essentially independent of external conditions, for the driver or drivers for the duration of a voltage pulse, in particular a square-wave pulse, which is preset by the device and whose length corresponds to the desired slope time, and, during this time period, with the previously discharged reference capacitance being charged by means of the current source to the reference voltage value.

The output voltage value and the reference voltage value may be compared in a comparator, with the slope time of the output voltages which are emitted to the load being adjusted on the basis of these comparison results.

The individual method steps can be repeated in order to produce a control cycle. In this case, the driver strength of each driver is in each case matched with a delay of one clock cycle. However, this is generally not disadvantageous since the external conditions normally change only slowly.

An arrangement according to the invention and as described above for adjustment of one or more drivers and/or a driver circuit according to the invention as described above and/or a method according to the invention as described above may particularly advantageously be used in conjunction with integrated circuits, with the individual drivers preferably being in the form of pad drivers.

BRIEF DESCRIPTION OF THE DRAWINGS

The invention will now be explained in more detail using exemplary embodiments with reference to the attached drawings, in which:

FIG. 1 shows a schematic circuit arrangement of a driver circuit according to the invention;

FIG. 2 shows a schematic circuit arrangement of a device for presetting the desired slope time for the driver or drivers according to the present invention; and FIG. 3 shows a schematic circuit arrangement of a scalable driver comprising a number of partial driver elements.

DETAILED DESCRIPTION OF THE INVENTION

FIG. 1 shows a driver circuit which, by way of example, is arranged on a chip 11 as a driver circuit for pad drivers for integrated circuits. First of all, the driver circuit has an adjustable driver 90, which has a driver input 92 and a driver output 93. The driver 90 is connected via the driver output 93 to a load, in the present case a load capacitance 12. For sake of clarity, FIG. 1 shows only a single driver 90.

The driver 90 is connected via a control line (driver enable bus DEB) to an apparatus 51 for selection of the driver strength, which is referred to as a driver strength selector.

As is shown in FIG. 3, the adjustable driver 90 may be formed from a number of driver elements 91. Each driver element 91 is connected to the driver strength selector 51 via a control line 52.

As can be seen from FIG. 1, the driver strength selector 51 is a component of an arrangement 10 for adjustment of the slope times for one or more drivers 90. The arrangement 10 first of all has an apparatus 20 for recording the rate of change of an output voltage and, in the present exemplary embodiment, this apparatus 20 is in the form of a window comparator. The window comparator 20 is connected firstly to the driver output 93.

The window comparator 20 has two voltage comparators CP1 and CP2, which are annotated by the reference numbers 21 and 22. The two voltage comparators 21, 22 are connected to one another via an AND gate 23.

Furthermore, the arrangement 10 has an apparatus 30 for production of an output voltage value. The apparatus 30 has a current source 31, a switch element 32 and a capacitance Cmeas, which is annotated by the reference symbol 33. The switch element 32 may be operated via signals which are emitted from the window comparator 20.

Furthermore, the arrangement 10 has an apparatus 40 for production of a reference voltage value. This apparatus 40 has a current source 41, a switch element 42 and a reference capacitance 43. The switch element 42 can be operated via signals from a device 60 for presetting a desired slope time.

The two apparatuses 30, 40 for production of the output voltage value and of the reference voltage value, respectively, are connected to a voltage comparator CP3, which is annotated by the reference number 50. The voltage comparator 50 is likewise connected to the driver strength selector 51.

The device 60, which is illustrated in FIG. 1, for presetting a desired slope time is described in more detail in FIG. 2. This device 60 has a number of delay elements 61, which convert an input signal, in the present case a system clock 63, to square-wave pulses 62 with different pulse lengths.

The individual delay elements 61 are combined to form a delay chain 68. A phase detector 64 and an apparatus 65 for production of a control voltage are also provided, for conversion of the voltage pulses as will be explained in more detail with reference to the method of operation of the arrangement 10 according to the invention. The device 60 furthermore has a number of AND gates 67. A desired square-wave pulse 62 which corresponds to the desired slope time is selected via a switch element 66 which may, for example, be in the form of a multiplexer.

The method of operation of the arrangement 10 for adjustment of the slope times for one or more drivers 90 essentially independently of external conditions will now be described, in the following text.

The fundamental principle of the arrangement according to the invention is the generation of a square-wave pulse 62 whose length corresponds to the desired slope time, which can be programmed by the user of the arrangement 10. The pulse length of the square-wave pulse 62 is compared with the actual slope time, and the scalable driver 90 is matched as a function of the result. The scalable driver 90 consists of a number of parallel partial driver elements 91, which can be enabled or inhibited individually by means of control lines 52. When the driver input 92 changes its state, all the enabled partial driver elements 91 switch in a corresponding manner and charge, or discharge, the connected load capacitance 12 via the driver output 93. In the following text, it is assumed that the driver input signal changes from low to high at the time t=0, that is to say the previously discharged load capacitance 12 is intended to be charged to an operating voltage Vdd over the further course of time.

After the activation of the driver elements 91, which is enabled at this moment, the output voltage at the driver output will rise until the operating voltage Vdd is reached. This time profile is monitored by the window comparator 20, which consists of the two voltage comparators 21 and 22 and the AND gate 23. The output of the window comparator switches to high precisely during the rise time of the voltage signal, with the rise time being that time which the voltage signal requires to change from 10% to 90% of the final voltage.

The time is now converted to a voltage value, by closing the switch 32 in the apparatus 30 while the window comparator 20 is in the high state, as a result of which the previously discharged measurement capacitance 33 is charged by means of the current source 31 to an output voltage value (Vmeas). The reference capacitance 43 is charged to a reference voltage value (Vref) via an identical structure in the apparatus 40, with the current source 41, switch element 42 and reference capacitance 43. The period during which the switch element 42 is closed is preset by the user via the device 60, and corresponds to the desired rise time (slope time).

The voltage comparator 50 then compares the output voltage value with the reference voltage value. If Vmeas<Vref, the capacitance 33 for the output voltage value has been charged for a shorter time than the reference capacitance 43, and the actual rise time has accordingly been shorter than that desired. The comparator 50 will indicate this by outputting a high level, as a result of which the driver capability of the adjustable driver 90 is reduced by the driver strength selector 51. An analogous situation applies to the case where Vmeas>Vref. The control cycle starts once again for the next rising slope, so that the driver 90 is successively matched to the load 12 and to the desired slope time.

The essential feature for the quality of the regulation is the exact generation of the desired slope time. This must not be dependent on external conditions. A system clock 63, which is available in microcontrollers, microprocessors or the like, is used for this reason, as is shown in FIG. 2. The system clock 63 may be assumed to be constant with regard to external conditions.

The input signal is the relatively low-frequency system clock 63, which passes through a delay chain 68 formed by delay elements 61. Each delay element 61 delays the output of the rising slope at its input, depending on the control voltage produced in the apparatus 65. The phase detector 64 checks whether the falling slope of the input signal 63 occurs at the same time as the rising slope, which is emitted with the delay, at the output of the delay chain 68. If this is not the case, the control voltage is changed in the apparatus 65, depending on which level change took place first, such that the phase difference becomes smaller in the next cycle. The falling slope of the input signal 63 may be passed on through the delay line 68 with virtually no delay.

If the input signal 63 is in each case linked to the output of each delay element 61 via corresponding AND gates 67, this results in n parallel signals, with the input signal 63 itself, in the form of square-wave pulses 62. The user uses the switch element 66, which is in the form of a multiplexer, to select from these a signal which is then used as the square-wave pulse 62 for production of the reference voltage value.

This makes it possible to adjust slope times essentially independently of external conditions. It is also advantageous that there is always a fixed and clear relationship between selected output pulse duration 62 and the system clock frequency 63.

In order to make it possible to make optimum use of the surface area available on a chip 11, a number of drivers 90 may in each case be connected to one and the same arrangement 10 for adjustment of the slope times. The drivers 90 may be connected to the arrangement 10 via suitable switch elements, for example multiplexers, so that the drivers 90 can be adjusted successively. The respective optimum driver strengths can be temporarily stored in a suitable memory device, which is not illustrated.

What is claimed is:

1. An arrangement for adjustment of the slope times for one or more drivers essentially independently of external conditions, comprising:
    an apparatus for recording the time duration of one slope of an output voltage which is emitted from the driver or drivers to a load;
    an apparatus for conversion of the measured time duration of one slope of the output voltage to an output voltage value, having an apparatus for production of a reference voltage value;
    a device for presetting a desired slope time, which is essentially independent of external conditions, for the driver or drivers, which device is connected to the apparatus for production of a reference voltage value; and
    a device for comparison of the output voltage value with the reference voltage value, in which case the comparison device is or can be connected to the driver or drivers.

2. The arrangement as claimed in claim 1, characterized in that the apparatus for recording the time duration of one slope of the output voltage which is emitted from the driver or drivers to a load is in the form of a window comparator.

3. The arrangement as claimed in claim 2, characterized in that the window comparator has two voltage comparators, which are connected to an AND gate.

4. The arrangement as claimed in claim 1, characterized in that the apparatus for conversion of the measured time duration of one slope of the output voltage to an output voltage value has a current source, a switch element and a capacitance, in which case the switch element is operated or can be operated via signals from the apparatus for recording the time duration of one slope of the output voltage which is emitted from the driver or drivers to a load.

5. The arrangement as claimed in claim 1, characterized in that the apparatus for production of a reference voltage value has a current source, a switch element and a reference capacitance, in which case the switch element is operated or can be operated via signals from the device for presetting a desired slope time for the driver or drivers.

6. The arrangement as claimed in claim 1, characterized in that the device for comparison of the output voltage value with the reference voltage value is in the form of a comparator.

7. The arrangement as claimed in claim 1, characterized in that an apparatus is provided for selection of the driver strength, in that the apparatus is connected to the device for comparison of the output voltage value with the reference voltage value, and in that the apparatus for selection of the driver strength is or can be connected to the driver or drivers as well.

8. The arrangement as claimed in claim 1, characterized in that the device for presetting the desired slope time for the driver or drivers is designed for production of a square-wave pulse, whose length corresponds to the desired slope time.

9. The arrangement as claimed in claim 1, characterized in that the device for presetting the desired slope time for the driver or drivers is designed for processing a system clock.

10. The arrangement as claimed in claim 1, characterized in that the device for presetting the desired slope time for the driver or drivers has one or more delay elements.

11. The arrangement as claimed in claim 1, characterized in that the device for presetting the desired slope time for the driver or drivers has at least one phase detector.

12. The arrangement as claimed in claim 1, characterized in that the device for presetting the desired slope time for the driver or drivers has at least one apparatus for production of a control voltage.

13. The arrangement as claimed in claim 1, characterized in that the device for presetting the desired slope time for the driver or drivers has at least one switch element, in particular a multiplexer, for switching between different slope time signals.

14. A driver circuit for driving a load, the driver circuit having one or more drivers which are connected to the load, characterized in that the one or more drivers are connected to the arrangement for adjustment of the slope times as claimed in claim 1.

15. The driver circuit as claimed in claim 14, characterized in that the one or more drivers are in the form of scalable drivers.

16. The driver circuit as claimed in claim 15, characterized in that the one or more drivers have one or more partial driver elements.

17. The driver circuit as claimed in claim 14, characterized in that the one or more drivers are each connected to an arrangement for adjustment of the slope times.

18. The driver circuit as claimed in claim 17, in which a number of drivers are connected to an arrangement for adjustment of the slope times, characterized in that the drivers are connected to the arrangement via a switch element, in particular a multiplexer.

19. The driver circuit as claimed in claim 14, characterized in that the load is in the form of a capacitive load.

20. A method for adjustment of the slope times for one or more drivers essentially independently of external conditions, in particular using an arrangement as claimed in claim 1, characterized by the following steps:
    a) measuring the time duration of one slope of an output voltage which is emitted from the one or more drivers to a load;
    b) converting the measured time duration of one slope of the output voltage to an output voltage value;
    c) producing a reference voltage value which is essentially independent of external conditions;
    d) comparing the output voltage value with the reference voltage value; and
    e) matching of the one or more drivers as a function of the comparison results.

21. The method as claimed in claim 20, characterized in that the time profile of the output voltage is measured by measuring its rise time or its fall time.

22. The method as claimed in claim 20, characterized in that the measured time profile of the output voltage is convened in an apparatus for conversion to an output voltage value.

23. The method as claimed in claim 22, characterized in that the apparatus for conversion of the time duration of one slope of the output voltage has a current source, a switch element and a capacitance, and in that the time profile of the output voltage is convened to an output voltage value by closing the switch element during a predetermined time period, in particular during the rise time or the fall time of the output voltage, and in that, during this time period, the previously discharged capacitance is charged by means of the current source to the output voltage value.

24. The method as claimed in claim 20, characterized in that the reference voltage value is produced in an apparatus for production of a reference voltage value, with the apparatus having a current source, a switch element and a reference capacitance, by the switch element being closed via a device for presetting a desired slope time, which is essentially independent of external conditions, far the driver or drivers for the duration of a voltage pulse, in particular a square-wave pulse, which is preset by the device and whose length corresponds to the desired slope time, and in that, during this time period, the previously discharged reference capacitance is charged by means of the current source to the reference voltage value.

25. The method as claimed in claim 20, characterized in that the output voltage value and the reference voltage value are compared in a comparator which provides comparison results, and in that the slope time of the output voltage which is emitted to the load is adjusted on the basis of the comparison results.

26. The method as claimed in claim 20, characterized in that the individual method steps are repeated in order to produce a control cycle.

27. Use of an arrangement as claimed in claim 1 for adjustment of one or more pad drivers for integrated circuits.

28. Use of a driver circuit as claimed in claim 14 as a pad driver for integrated circuits.

29. Use of a method as claimed in claim 20 for adjustment of one or more pad drivers for integrated circuits.

* * * * *

UNITED STATES PATENT AND TRADEMARK OFFICE
CERTIFICATE OF CORRECTION

PATENT NO. : 6,777,974 B2
APPLICATION NO. : 10/148747
DATED : August 17, 2004
INVENTOR(S) : Herbert Eichfeld et al.

It is certified that error appears in the above-identified patent and that said Letters Patent is hereby corrected as shown below:

In column 13, line 21, please replace "far" with --for--.

Signed and Sealed this

Twenty-ninth Day of July, 2008

JON W. DUDAS
*Director of the United States Patent and Trademark Office*